United States Patent [19]
Falk et al.

[11] Patent Number: 5,005,145
[45] Date of Patent: Apr. 2, 1991

[54] METHOD AND APPARATUS FOR CALIBRATING A SCAN CONVERTOR

[75] Inventors: Timothy L. Falk; Geoffrey B. Rhoads, both of Vancouver, Wash.

[73] Assignee: Tektronix, Inc., Beaverton, Oreg.

[21] Appl. No.: 367,997

[22] Filed: Jun. 19, 1989

[51] Int. Cl.⁵ .................... G01R 35/00; G01R 13/00
[52] U.S. Cl. .......................... 364/571.02; 324/121 R; 364/487; 364/553; 364/571.05
[58] Field of Search .................... 358/166; 324/121 R; 364/487, 553, 571.02, 571.05

[56] References Cited

U.S. PATENT DOCUMENTS

| | | | |
|---|---|---|---|
| 4,153,915 | 5/1979 | McKechnie et al. | 358/166 X |
| 4,553,091 | 11/1985 | Bristol | 324/121 R X |
| 4,647,922 | 3/1987 | Saxe | 324/121 R X |
| 4,658,286 | 4/1987 | Schwartz et al. | 358/166 X |
| 4,789,893 | 12/1988 | Weston | 358/166 X |
| 4,855,930 | 8/1989 | Chao et al. | 364/497 |
| 4,868,465 | 9/1989 | Stevens et al. | 324/121 R X |
| 4,873,646 | 10/1989 | Stoops | 364/487 |

*Primary Examiner*—Parshotam S. Lall
*Assistant Examiner*—Edward R. Cosimano
*Attorney, Agent, or Firm*—Alan T. McCollom; William K. Bucher

[57] ABSTRACT

An oscilloscope includes a digitizing camera mounted thereon for recording waveforms on the oscilloscope screen. The digitized signals representing the waveforms are stored in the computer. In the calibration process a plurality of baselines substantially equidistant from one another are scanned on the screen and thereafter a plurality of sine waves are scanned. The phase differences between each sine wave and an associated ideal sine wave are determined and are used to create a map which associates each point on a waveform of interest appearing on the oscillosope screen with a time value that corrects for nonlinearities in the horizontal axis which are injected by the optics, nonlinear voltages, etc. Another map is created utilizing the baseline scan which corrects for such nonlinearities in the vertical axis. A data waveform of interest appearing on the scope is mapped from its physical location on the target, using the time and voltage maps, onto a record which is corrected for nonlinearities and gain errors.

16 Claims, 9 Drawing Sheets

METHOD AND APPARATUS FOR CALIBRATING A SCAN CONVERTOR

1. FIELD OF THE INVENTION

The present invention relates to methods and apparatus for calibrating a scan convertor and more particularly to such methods and apparatus which are used in connection with scan convertors of the type which produce a digitized waveform.

2. DESCRIPTION OF THE RELATED ART

A scan convertor is an instrument which measures and records waveforms by utilizing a target horizontal axis corresponding to time, through application of a periodic linear ramp signal, and a vertical axis to which a voltage signal is applied. A waveform of interest can thus be recorded on the target.

In some scan convertors, the signal captured on the target is digitized for manipulation and analysis by a computer. In one such system a video camera is aimed at an oscilloscope display thereby creating a video signal which, in the case of a video camera having a charge coupled device target, is digitized for storage and use by the computer.

Scan convertors have error sources which can affect the measurement and recording of a waveform of interest. Errors may be injected into the measurement and recording process as a result of geometric distortion, such as that caused by the electron optics. Nonlinearities in the ramp signal which creates a time scale on the horizontal axis of the target likewise produce errors. Nonlinearities in the vertical or voltage axis may be injected due to a vertical amplifier which is less than perfectly linear.

One prior art method for calibrating the voltage and time axes of a scan convertor includes measuring a signal having a known duration, in the case of time calibration, and a known amplitude, in the case of voltage calibration. The measurements are used to create a time scaling factor and a voltage scaling factor which are each applied at all target dimensions. Such linear scaling calibration places the scan convertor into nominal calibration; however, the accuracy thereof varies as a function of target location and time and voltage scales. Such linear scaling cannot correct for the errors described above at all target locations and for all scales due to the nonlinear nature of the error sources.

One prior art scan convertor calibration system addresses this problem by creating a map which relates vertical target position to a calibrated voltage value. This is accomplished by scanning the target with a plurality of DC baselines spaced vertically from one another with each baseline having a known DC voltage. Distortion produced by the electron optics typically causes the outer ends of the upper baselines to curve upwardly and the outer ends of the lower baselines to curve downwardly. These baselines are digitized and stored to create a map having a plurality of known target positions (the baselines) each of which has a reference voltage associated therewith.

When the target is scanned with a data waveform of interest, the waveform is digitized with each point therealong falling between a pair of the baselines in the map. A voltage value is assigned to each target position in the data waveform by linearly interpolating a voltage value based on (a) the voltage values of the baselines immediately above and below each point in the waveform and (b) the distance from the point to each baseline. When the target is scanned with a sufficient number of calibration baselines which are digitized and stored as described above and when each target location in a data waveform of interest is mapped onto a voltage scale, also as described, substantially all the nonlinearities relating to voltage recording and measurement are corrected.

The prior art system that creates a map which relates vertical target position to a calibrated voltage value as described above also creates a map which is intended to relate horizontal target position to a calibrated time value, as follows: the target is scanned with a plurality of square waves having a known period with the square waves being space vertically from one another. Each square wave transition from low to high or vice versa is located in the digital record of the square waves. For each square wave, a predetermined number of timing points distributed along the x-axis are generated by interpolating between the located transitions. The map so created relates a horizontal target position to a time referenced to the square wave calibration source. Although better than utilizing a single global scaling factor, this prior art method was provided for only one time scale of the scan convertor and did not substantially eliminate nonlinearities in the horizontal axis, even in the scale in which the calibration procedure was performed.

SUMMARY OF THE INVENTION

It is an object of the present invention to provide a method and apparatus for calibrating a scan convertor which overcomes the above enumerated disadvantages associated with prior art methods and apparatus.

It is a more specific object of the invention to provide such a method and apparatus which corrects error injected due to geometric distortion, nonlinearities of the ramp voltage and other voltage nonlinearity, e.g., in amplifiers.

It is another more specific object of the present invention to provide such a method and apparatus which an operator of a scan convertor can quickly and easily perform.

It is another more specific object of the present invention to provide such a method and apparatus which performs the calibration on the time and voltage scales of interest, i.e., on those scales with which a data waveform of interest is to be measured and recorded.

A method for calibrating a scan convertor of the type having a scanning target which has a horizontal axis related to time and a vertical axis related to voltage wherein the target is scanned with a calibration periodic waveform having a known frequency. The calibration waveform is estimated with an ideal waveform and the phase differences between the ideal waveform and the calibration waveform are calculated. The calculated phase differences are used to map a physical location on the target to a location on a time scale.

Apparatus is provided for implementing the method of the invention.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
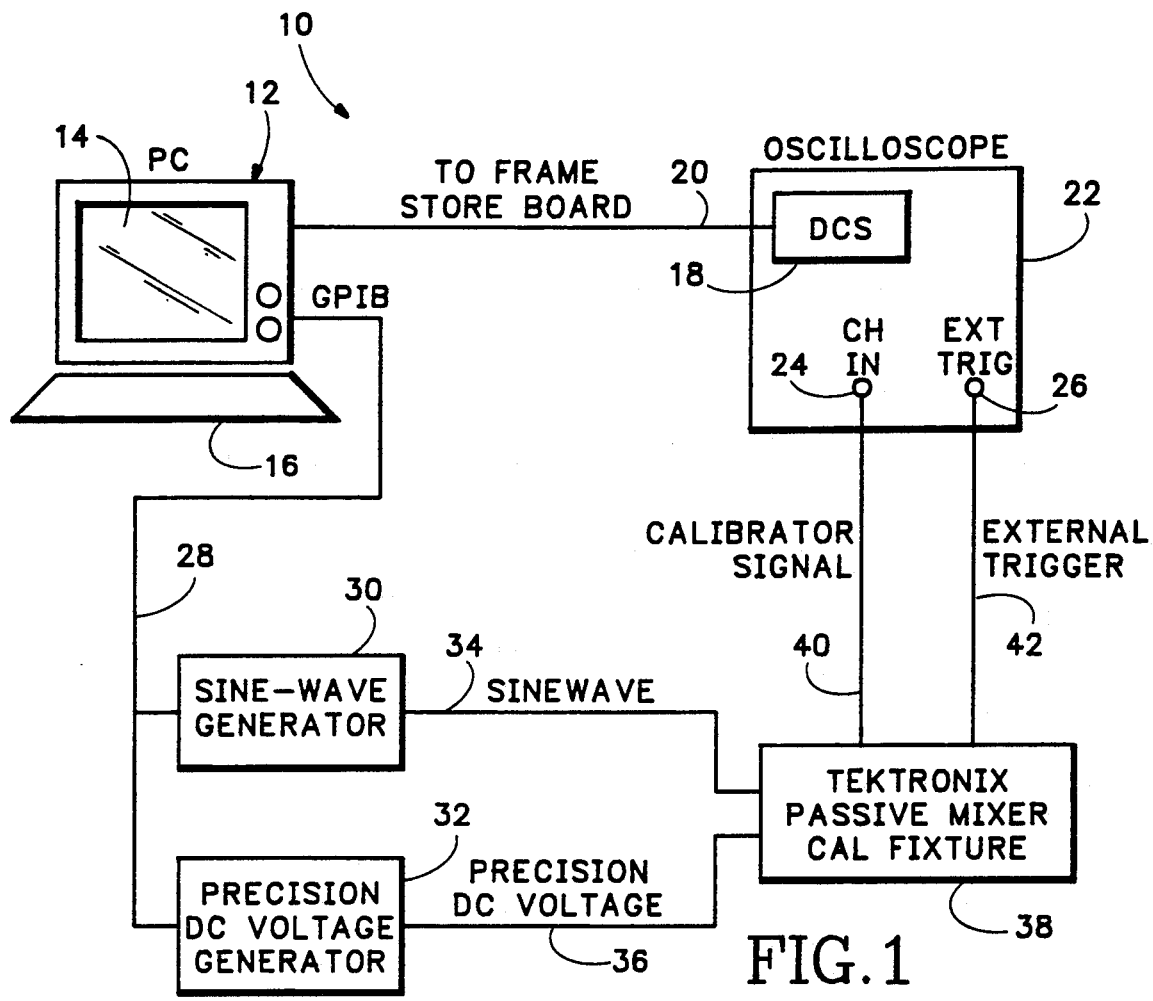
FIG. 1 is a block diagram of apparatus constructed in accordance with the present invention.

Indicated generally at 10 is a digitizer system constructed in accordance with the present invention. Included therein is a personal computer 12 having a monitor 14 and a keyboard 16. The personal computer includes the usual digital memory (not visible) which contains, among other things, a computer program written in accordance with the flow chart of FIGS. 3A-C.

Also included in computer 12 is a conventional video frame store board (not visible). The board is connected to a conventional video camera 18 via cable 20. The frame store board stores the camera signal in a random access memory and processes it to produce 512 digital values for each horizontal line of video information.

Camera 18 is mounted on a conventional oscilloscope 22 having a display screen (not visible in FIG. 1) over which the camera is mounted. The oscilloscope can display a time-varying signal of interest on the screen with the x-axis corresponding to time and the y-axis corresponding to voltage. The usual controls, not shown, allow the operator to select the time and voltage scales which most effectively display a waveform of interest. Camera 18 includes a lens (not visible) which focuses the image on the oscilloscope display screen onto a charge-coupled device (CCD) in the camera. Camera 18 and oscilloscope 22 are referred to herein as a scan convertor with the CCD in the camera being identified as a scanning target having a horizontal axis related to time and a vertical axis related to voltage.

Oscilloscope 22 includes a data input channel 24 and a trigger input 26. Signals appearing on channel 24 are applied to the vertical amplifier for display on the oscilloscope screen while a signal appearing on trigger input 26 initiates a substantially linear ramp signal which sweeps the signal on channel 26 across the oscilloscope screen at a preselected rate.

A bus 28 has one end connected to a conventional output port in computer 12. A conventional sine wave generator 30, such being referred to herein as a periodic waveform generator, and a conventional DC voltage generator 32 each have inputs connected to bus 28. Sine wave generator 30 generates known sine waves having preselected magnitudes and frequencies and applies a sine wave so generated to a conductor 34. Sine waves produced by generator 30 are referred to herein as a reference periodic waveform and as a calibration periodic waveform.

Figure 2:
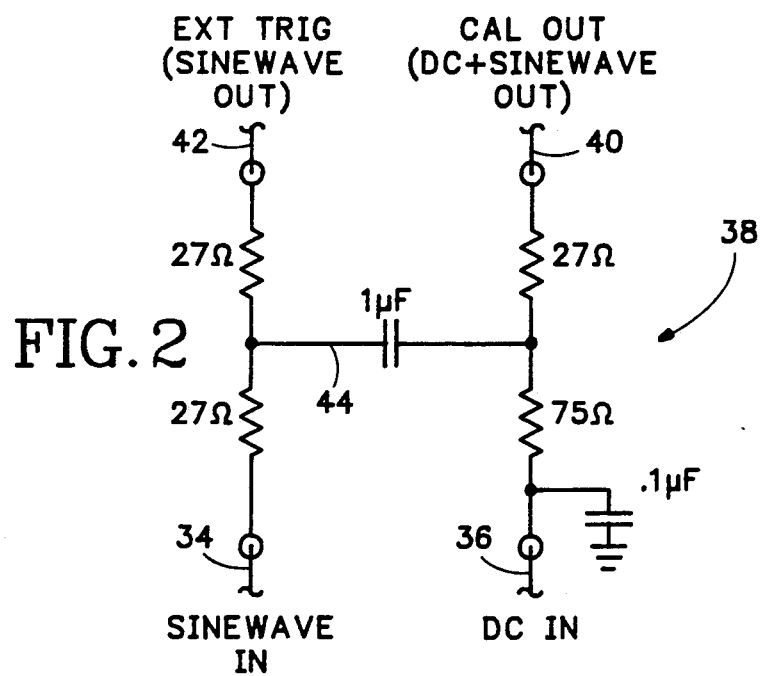
FIG. 2 is schematic diagram of a portion of the apparatus illustrated in FIG. 1.

DC voltage generator 32 produces DC levels, referred to herein as a calibration baseline voltage, which are applied to a conductor 36. Generators 30, 32 produce such outputs on conductors 34, 36, respectively, responsive to signals on bus 28 generated by computer 12 under the control of the computer program illustrated in the flow chart of FIGS. 3A-3C. Conductors 34, 36 are connected to a calibration fixture 38. Conductors 40, 42 connect fixture 38 to input channel 24 and trigger input 26, respectively. Reference is made to FIG. 2 for a schematic view of calibration fixture 38.

Calibration fixture 38 includes therein a coupling capacitor 44 disposed between the conductors carrying the sine wave and DC voltages. The capacitor couples the sine wave on conductor 34 to conductor 40. Thus, when generators 30, 32 simultaneously generate a sine wave and a DC baseline, the sine wave, without DC bias, appears on conductor 42 and the sine wave biased by the amount of the DC baseline, i.e., the DC signal plus the sine wave, appears on conductor 40. The signal on conductor 42 can thus be used to trigger the scope to scan the oscilloscope target to display the signal appearing on conductor 40.

Consideration will now be given to the manner in which system 10 operates with reference to the flow chart of FIG. 3A-C and to the waveforms and graphical representations of digital data in the remaining figures. Each of the boxes containing flow chart information in FIG. 3A-3C has been labeled with a letter or letters so that reference herein can be readily made to an operation described in the flow chart.

Initially, a user of system 10 selects the volts per division and time per division settings on oscilloscope 22 which provide a suitable scale for displaying a data waveform of interest on the oscilloscope screen. The user enters the selected vertical (volts per division) and horizontal (time per division) scale settings into computer 12 via keyboard 16. In addition, a mid-level voltage is entered by the user to assign a DC voltage level at the center of the oscilloscope display. This setting determines the ground level and should be selected so that when the data waveform of interest is applied to the oscilloscope, after calibration, it will appear roughly in the center thereof.

In Box B, the data entered in Box A is used to calculate a sine wave frequency which, when displayed on the oscilloscope screen, will produce approximately 9-10 cycles of the sine wave across the screen. Also, DC voltage values are determined which will place 8 calibration baseline voltages substantially evenly spaced vertically across the screen.

In Box C, a DC voltage is displayed at the mid-level of the screen, the trace is recorded by camera 18 and digitized in the usual fashion with the resulting digital data being stored in computer 12. Such occurs under the control of the program, via digital commands applied on bus 28, based on the data entered in Box A. The program causes signals to appear on bus 28 which instruct DC voltage generator 32 to place a selected DC voltage on conductor 36 which is passed through calibration fixture 38, via resistors as shown, in FIG. 2 and applied to the vertical amplifier of the oscilloscope.

Figure 4:
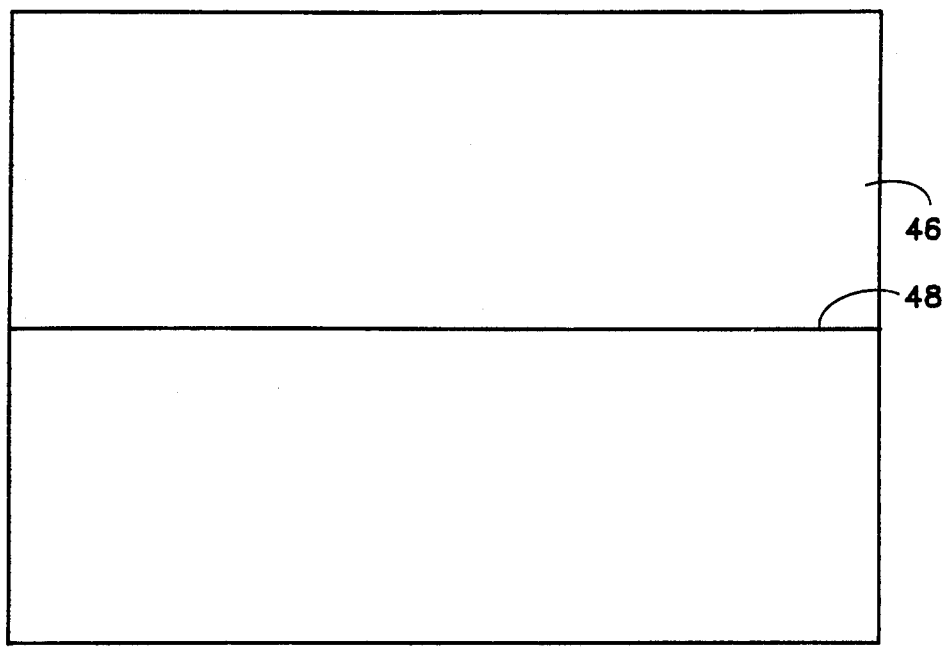
FIGS. 4-5 and 7-8 illustrate waveforms appearing on the target of the camera in FIG. 1.

Turning attention to FIG. 4, illustrated therein is a screen 46, upon which the signals applied to oscilloscope 22 via conductor 40 are displayed. Screen 46 is not visible in FIG. 1 because camera 18 is mounted thereover. The DC baseline generated as a result of Box C is illustrated as a baseline 48 on screen 46 in FIG. 4. It is to be appreciated that whenever oscilloscope screen 46 is scanned the CCD target (not visible) in camera 18 is similarly scanned because the camera is focused on the oscilloscope screen.

Figure 5:
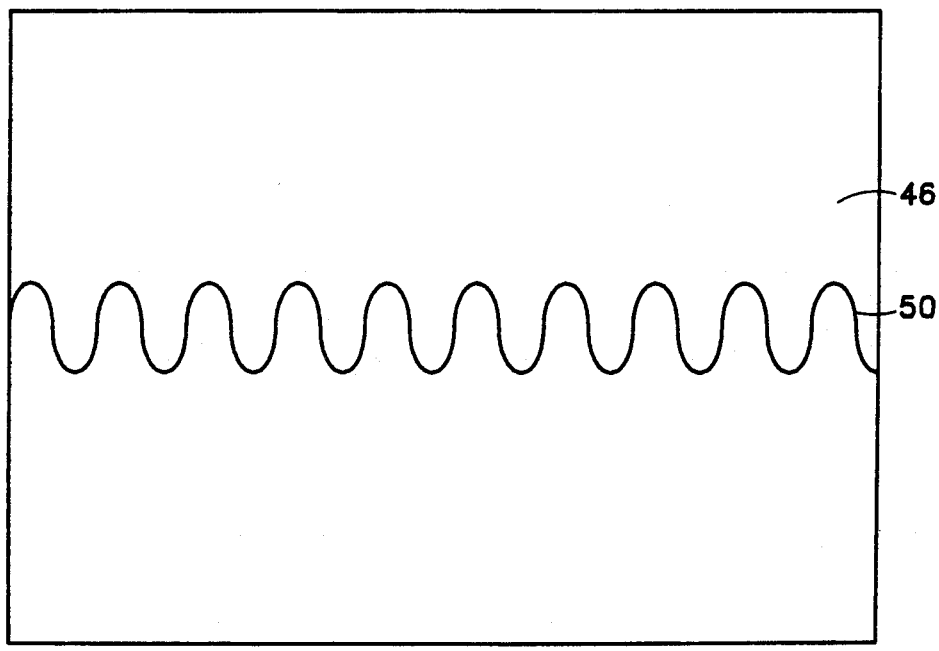

In Box D, a reference sine wave is displayed at the centerline of the scope screen. This waveform is recorded and digitized by camera 18 in the same fashion as the baseline was in Box C and is stored in the memory of computer 12, as was the baseline. This sine wave, identified as sine wave 50 in FIG. 5, is generated by appropriate signals applied to bus 28 which are based on the information relating to the oscilloscope scale and mid-screen voltage entered in Box A. The signals on bus 28 cause DC generator 32 to generate a DC level which, when added to the sine wave generated by sine wave generator 30, causes the sine wave to appear on the centerline of screen 46. The sine wave magnitude and frequency, also produced as a result of the information in signals appearing on bus 28, is between 9 and 10 complete cycles. It is to be appreciated that the DC value of baseline 48 is the same as that produced when sine wave 50 is generated thus causing baseline 48 and sine wave 50 to appear at the center of the screen.

In Boxes E through H, the stored baseline and reference sine wave 50 are processed as follows: In Box E, the digital record is examined to determine the starting point, i.e., where nonzero data begins and the ending point, i.e., where nonzero data ends, of stored sine wave 50 and baseline 48. Next, in Box F, conventional programming techniques are used to fill holes or gaps in the stored baseline and sine wave records. In Box G, the baseline and sine wave are digitally filtered using a conventional digital filter and in Box H, the base line record is subtracted from the sine wave record to produce a zero-centered sine wave.

Next, in Box I an ideal sine wave (not shown in the drawing) is generating using a closed form estimation which, as closely as possible, is fitted to stored reference sine wave 50. Such estimation techniques are known in the art. After so generating an ideal sine wave, conventional techniques are used to determine the amplitude, phase (relative to an arbitrary point in the digital record), frequency and residual DC level of the ideal waveform. Such estimates thus produce suitable average estimates of residual DC, amplitude, phase and frequency of the actual reference sine wave 50. In Box J the frequency and phase estimates determined in Box I are saved for later use as will be hereinafter explained.

Figure 6:
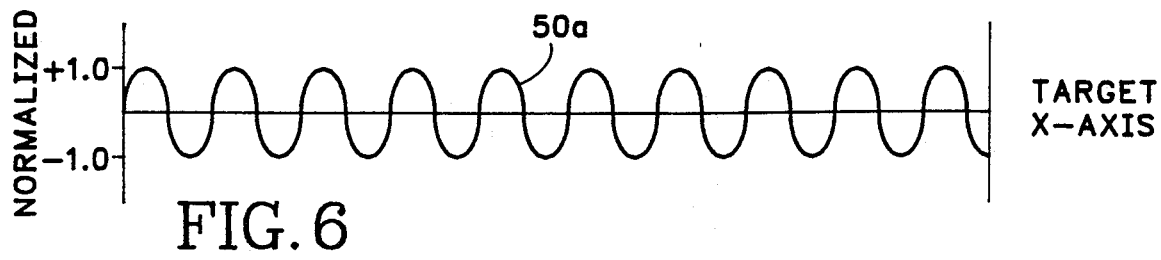
FIG. 6 is a plot of the sine wave shown in FIG. 5 which is stored in the memory of the computer in FIG. 1.

In Box K, the DC estimate determined in Box I is subtracted from the digital record of reference sine wave 50 to facilitate further analysis thereof. Next, in Box L, the reference sine wave is divided by its amplitude estimate to produce a normalized reference sine wave. The normalization step also facilitates further analysis. The normalized reference waveform, identified as sine wave 50a and shown as a solid line in FIG. 6, is saved in the computer memory. FIG. 6 is a graphical depiction of the data so stored.

In Boxes O and P, a series of baselines are swept across the face of the oscilloscope using the DC voltage steps determined in Box B, the magnitude of which, as will be recalled, are a function of the vertical scale on the oscilloscope which was entered into the computer in Box A. The result of scanning the screen with such baselines is illustrated as baselines 54–68 on screen 46 in FIG. 7. Such scanning is done pursuant to computer control via signals placed on bus 28. Baselines 54–68 are digitized in the usual manner and stored in the computer memory.

Figure 7:
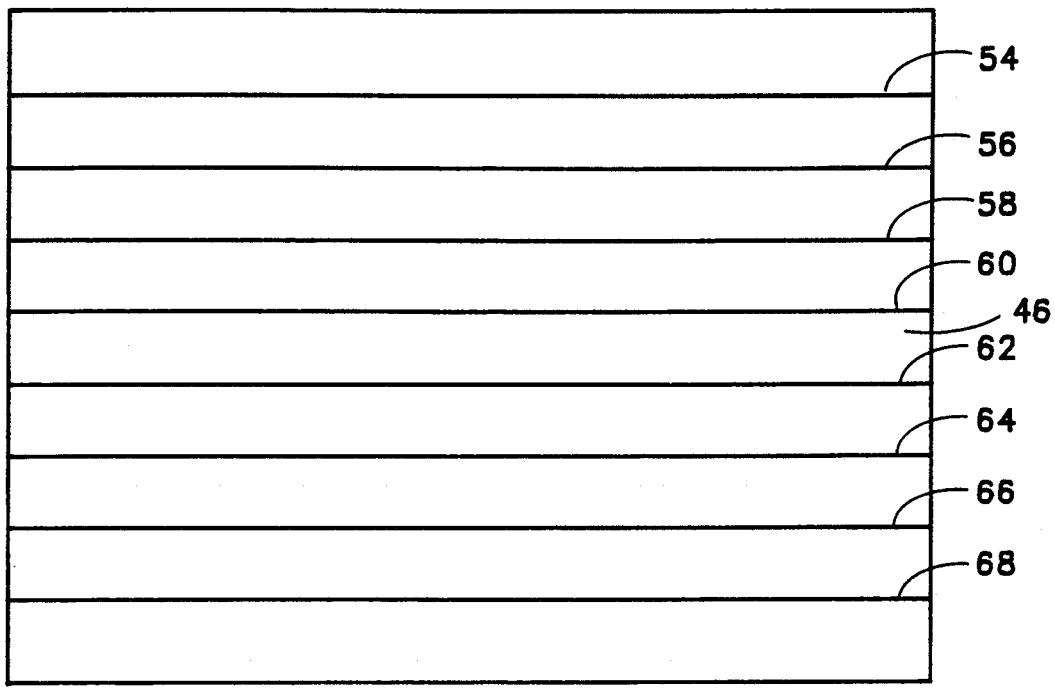
Figure 8:
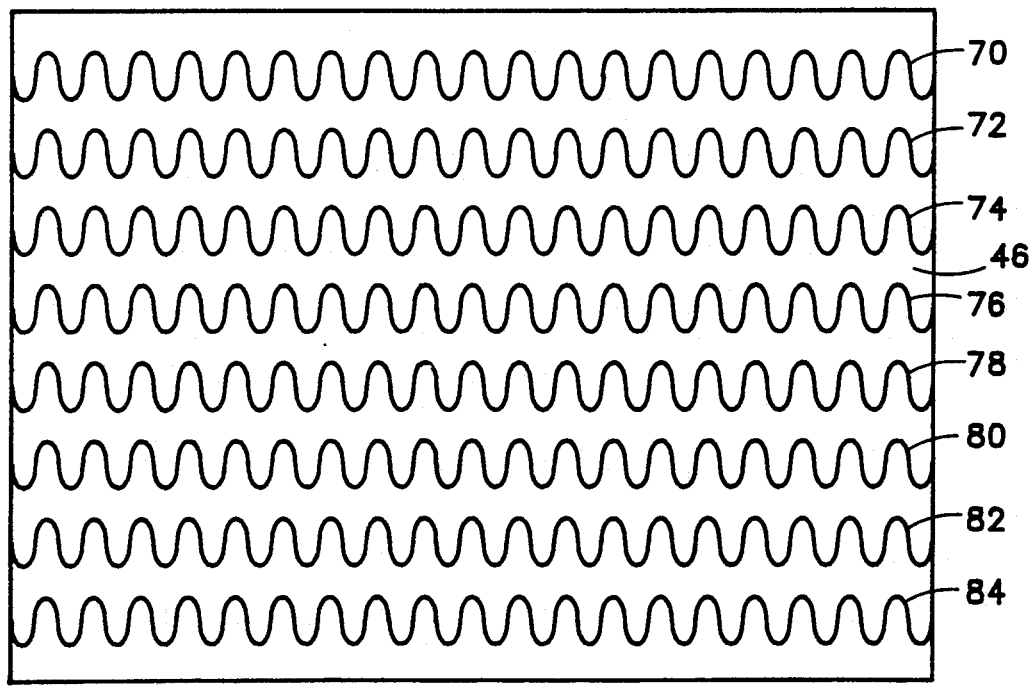

In box Q, the frequency and amplitude of a calibration sine wave are selected based on the data entered in Box A. Eight such sine waves are generated in boxes R and S with DC biases equal to baselines 54–68, respectively. The sine waves are shown as sine waves 70–84 in FIG. 8 which correspond to baselines 54–68, respectively. The signals appearing on the oscilloscope screen in FIG. 7 and 8 are generated by generators 30, 32 under control of the computer as previously described. As was the case with the baselines of FIG. 6, the sine waves are digitized by camera 18 with the results being stored in the computer memory.

Figure 14:
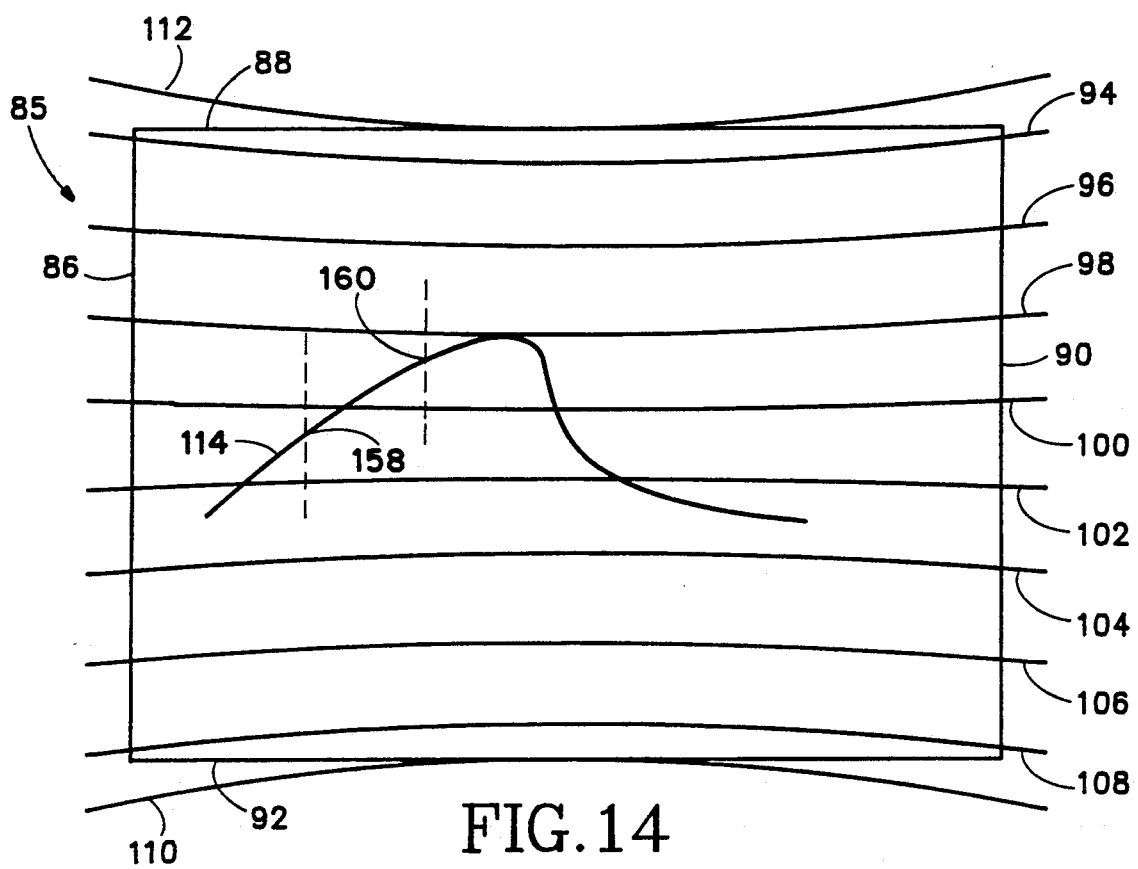
FIG. 14 is a plot of data waveform of interest superimposed on a voltage map.

In Boxes T, U and V, holes in the digital record of each baseline are filled, each baseline is digitally filtered to remove any high frequencies and the ends of the baselines are extrapolated so that each baseline goes from side-to-side of that portion of the digital record upon which data from the screen can be recorded. In FIG. 14, a graphical representation of a portion of the digital record representing the target of camera 18 is indicated generally at 85. Lines 86, 88, 90, 92 represent the boundaries of the CCD target in camera 18. Voltage map lines 94–108 are graphical representations of the digital information corresponding to baselines 54–68 as shown written on the oscilloscope screen in FIG. 7. As will be recalled, each line of video information is contained in 512 columns (horizontal target positions) into which the target is divided. The information represented graphically by lines 94–108 thus includes 512 discrete target positions, in digital form, which are each related to the constant voltage which defined the baseline on the CCD target.

In box W, additional voltage map lines 110, 112 are extrapolated on the lower and upper portions of the digital record representing the CCD target. Lines 110, 112 are extrapolated based on the configuration of the other lines to provide map lines near the very bottom and very top of the digital record representing the CCD target. Voltage map lines 94–112 in FIG. 14 will be utilized to map a data waveform 114 in a manner which will be more fully explained hereinafter.

In Boxes X, Y, Z, AA, BB, and CC each of the recorded calibration sine waves are processed in the same manner as the reference sine wave in Boxes F, G, H, I, K, and L, respectively. That is, holes are filled; the sine wave is filtered, and the associated baseline is subtracted therefrom. Next, an ideal sine wave is generated which estimates the calibration sine wave in order to provide an average value of the DC level and amplitude of the sine wave. The DC level is subtracted in Box BB and thereafter, in Box CC, the sine wave is divided by the amplitude estimate to normalize the sine wave for facilitating further analysis.

Figure 9:
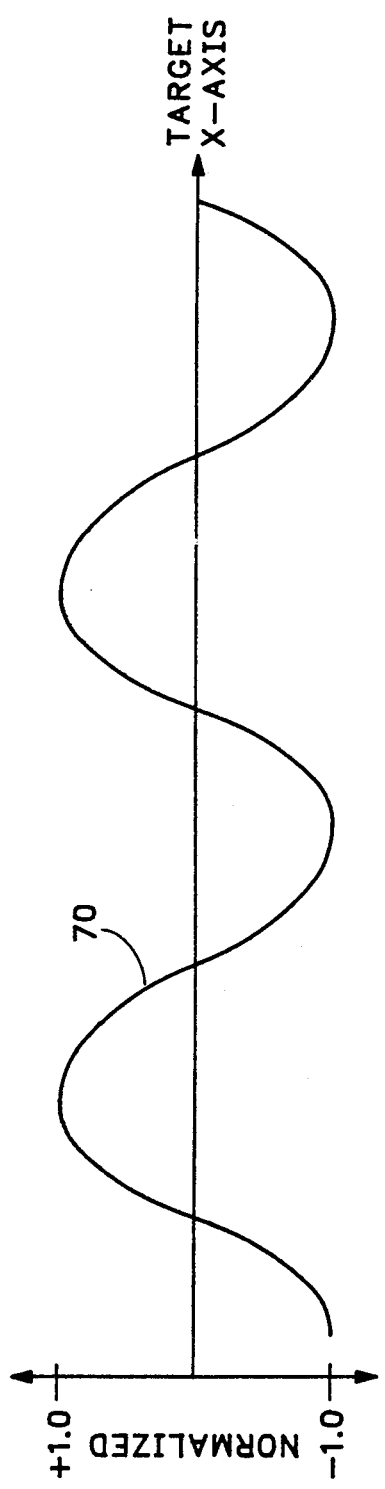
FIG. 9 is a plot of one of the sine waves shown in FIG. 8 which is stored in the memory of the computer in FIG. 1.

FIG. 9 is a graphical representation of the digital data recorded in connection with sine wave 70 in FIG. 8 after processing as set forth in Boxes X, Y, Z, AA, BB and CC.

Figure 10:
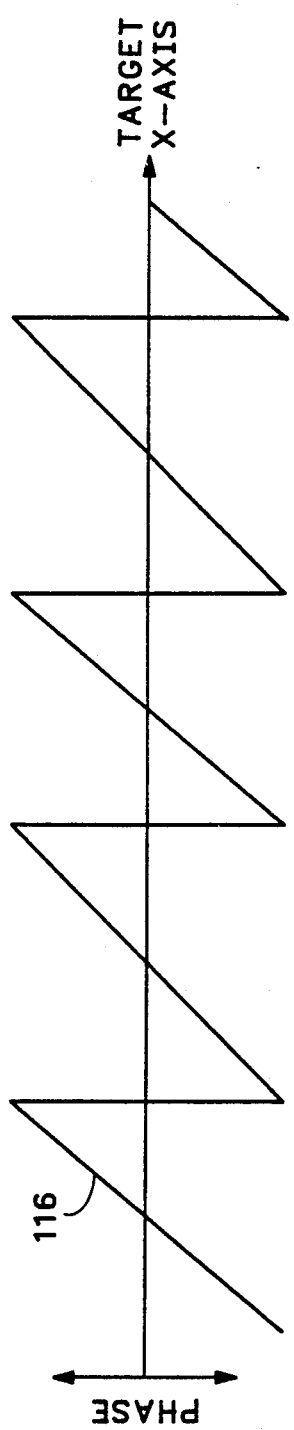
FIG. 10 is a plot stored in the computer memory of the arcsine of an ideal sine wave.
Figure 11:
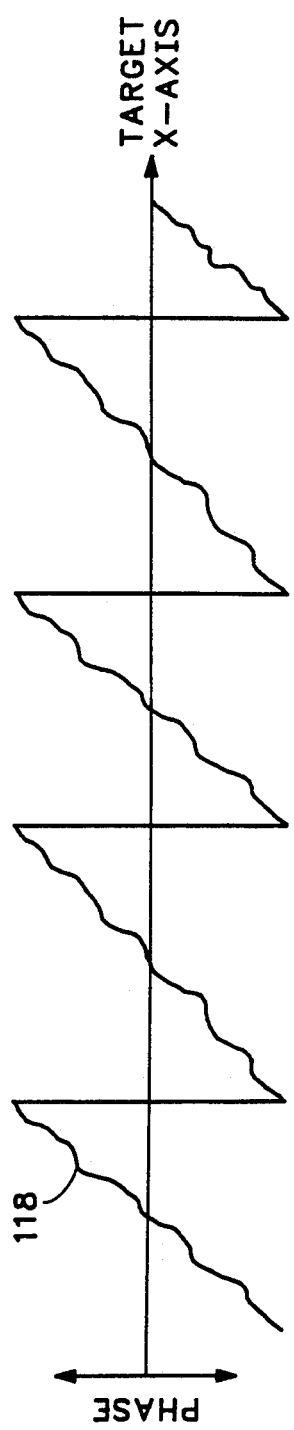
FIG. 11 is a plot stored in the computer memory of the arcsine of the sine wave of FIG. 9.

In FIG. 11, waveform 118, is a graphical representation of the arcsine of sine wave 70 in FIG. 9. The arcsine data in FIG. 11 is produced by fitting an arcsine sequence to sine wave 70 in FIG. 9 utilizing conventional programming techniques. This step is performed in Box DD. In FIG. 10, a waveform 116 is a graphical representation of data stored in the computer which represents the arcsine of the ideal calibration sine wave produced in Box AA.

Figure 12:
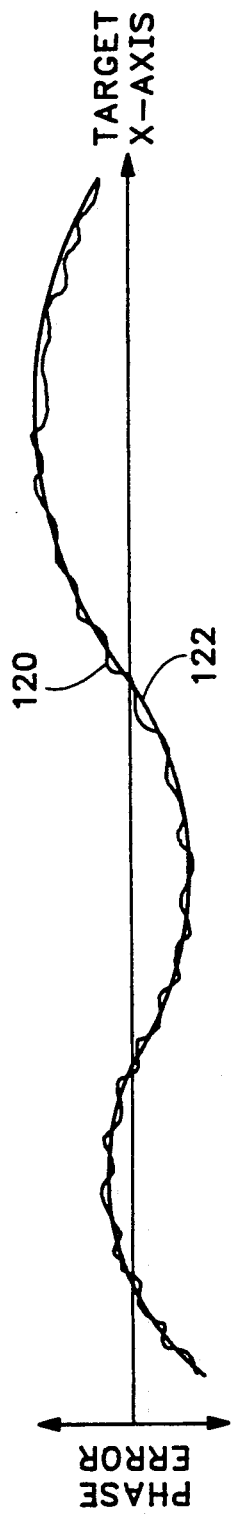
FIG. 12 is a plot of the FIG. 11 plot subtracted from the FIG. 10 plot.

Waveform 120, in FIG. 12, is produced by subtracting waveform 116 from waveform 118 which step is performed in Box EE.

In Box FF, waveform 120 is digitally filtered to produce a smooth error profile 122. Curve 122 is proportional to the phase differences between the actual calibration sine wave as recorded on the target of the camera and an ideal sine wave which has been fitted as closely as possible to the actual sine wave.

Figure 13:
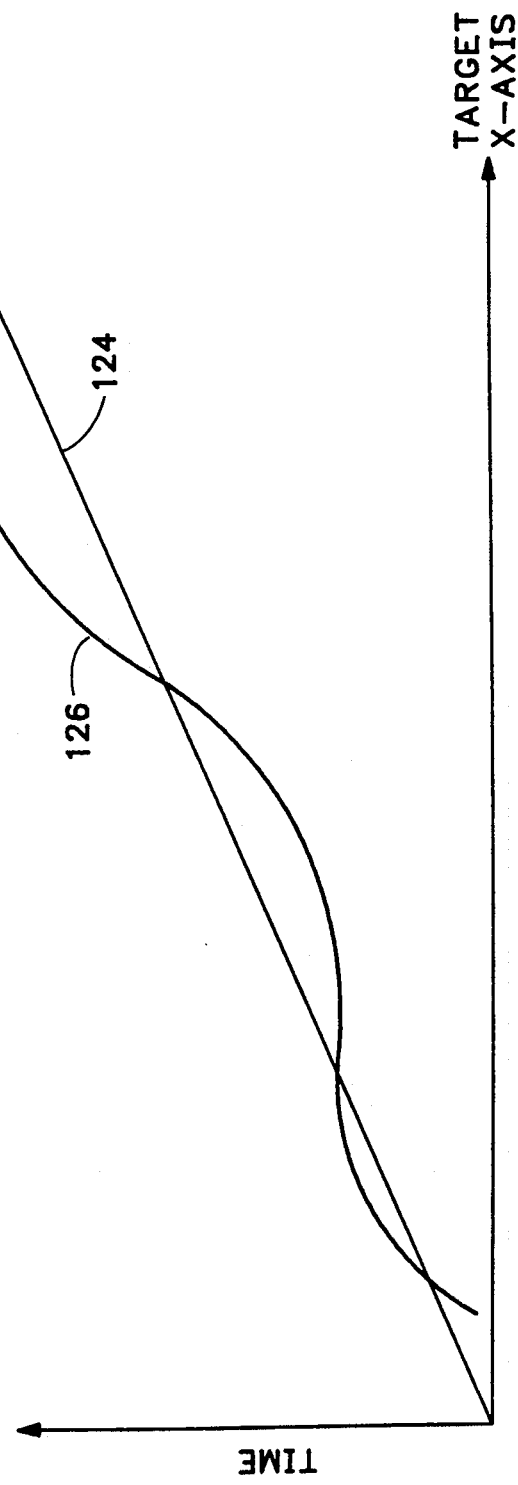
FIG. 13 is a plot of the FIG. 12 plot added to a plot of a perfectly linear ramp signal.

Waveform 124 in FIG. 13 represents the ideal ramp signal for the horizontal sweep on the oscilloscope, i.e., a perfectly linear ramp. Waveform 126 is equal to error curve 122 added to ideal ramp waveform 124. It can thus be seen that if waveform 126 was utilized as the horizontal sweep signal for signals appearing on baseline 54 in FIG. 7 (which is the mid-line of sine wave 70), the nonlinearities in the time scale reflected in curve 122 would be compensated for by utilizing waveform 126 as the horizontal sweep. It should be noted that the phase error, which is proportional to time, is converted by time units after curve 122 is determined in FIG. 12 so that the curve can be added to the ideal ramp signal as described above.

Figure 15:
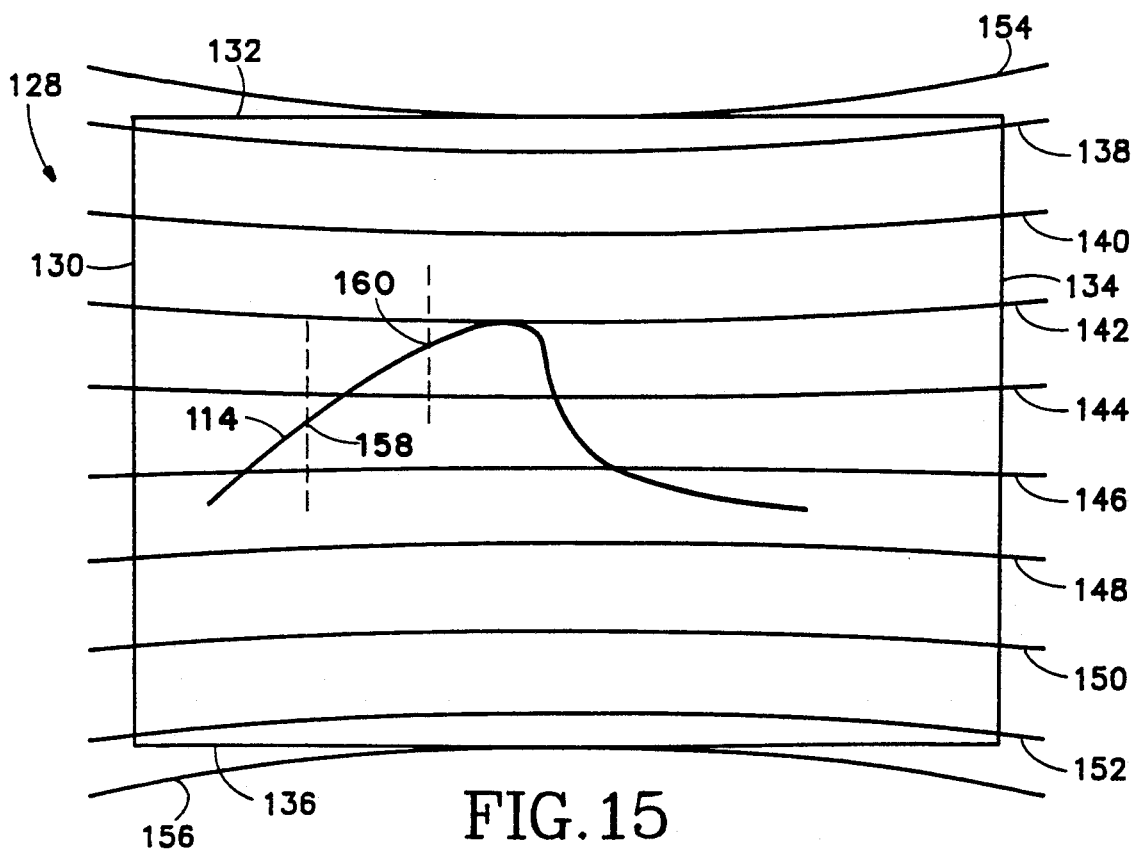
FIG. 15 is a plot of the data waveform of interest superimposed on a time map.

Turning attention now to FIG. 15, indicated generally at 128 is a second graphical depiction of a digital record representative of the scanning area of the CCD target in the camera. Such includes boundaries 130, 132, 134, 136 which represent the boundaries of the CCD target. A time map line 138 is plotted onto the digital record of the target in the same position as voltage map line 94, which as will be recalled was developed from baseline 54 in FIG. 7 (which is also the DC bias of sine wave 70 in FIG. 8). Time map line 138 includes 512 discrete time values, one for each column of video information, which are determined from the plot of FIG. 13. For each of the 512 positions located along the x-axis of the target, a time value is determined by waveform 126. The time value so determined is associated with the corresponding x-axis position on time map line 138. Generation of time map line 138 as described is performed in Box GG of the flow chart.

As indicated by the flow chart, each of the steps described in Boxes X-GG is performed in sequence on each of remaining sine waves 72-84 in the same manner as described in connection with sine wave 70. So performing the steps generates additional time map lines 140-152. Thereafter in Box HH, the ends of each of the times lines are extrapolated using conventional techniques to extend the time values on each line up to boundary lines 130-134.

In box II an additional time map line 154 on the top of graphical record 128 and time map line 156, on the bottom thereof, are extrapolated based on the time values contained in time map lines 138-152.

In Box JJ, digital record 85 and the voltage map lines associated therewith (in FIG. 14) and digital record 128 and the time map liens associated therewith (in FIG. 15) are stored in the computer memory with record 85 being referred to as a voltage calibration file and record 128 as a time calibration file.

Figure 3A:
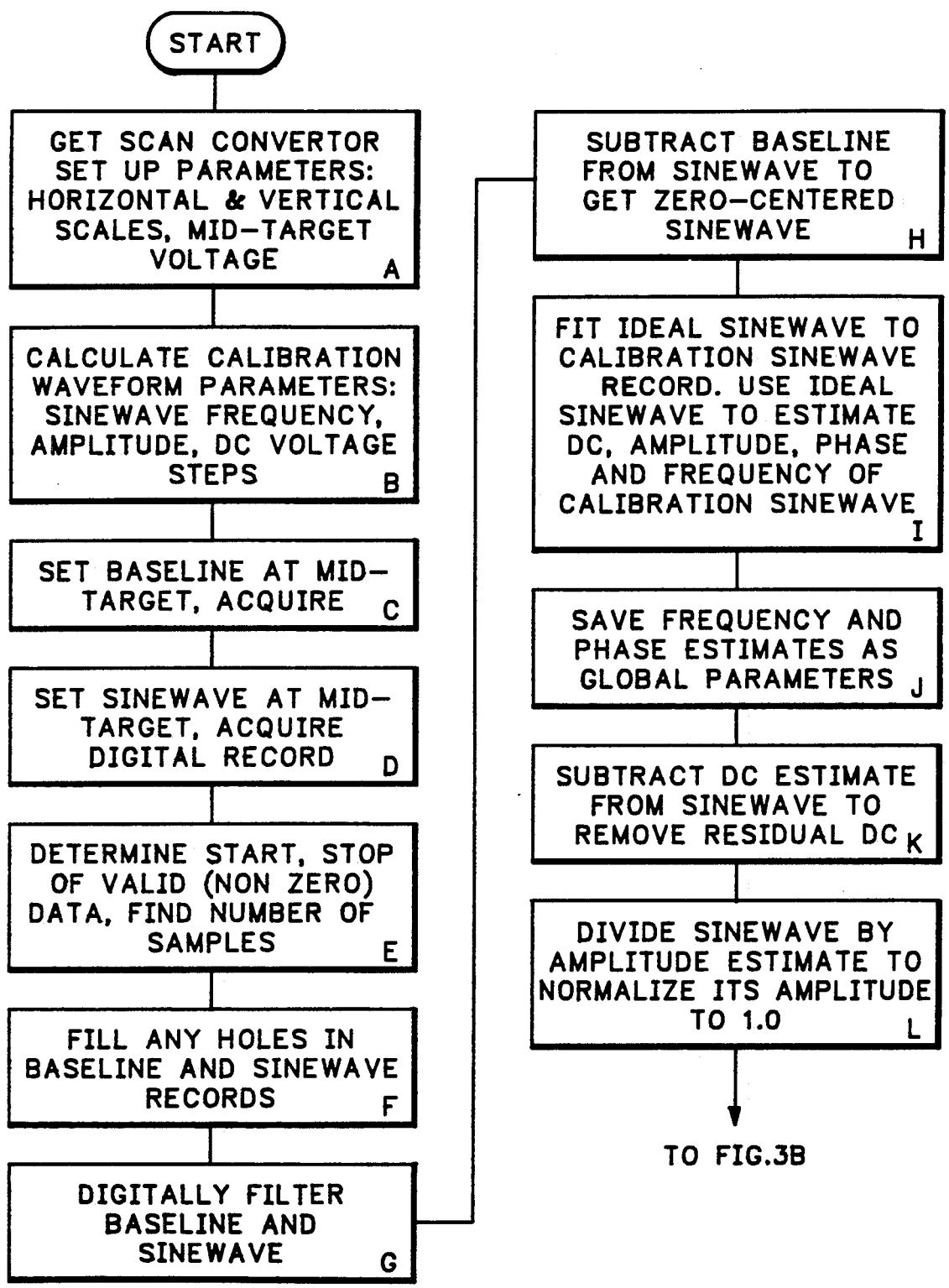
FIG. 3A, 3B and 3C is a flow chart illustrating method performed in accordance with the present invention.
Figure 3B:
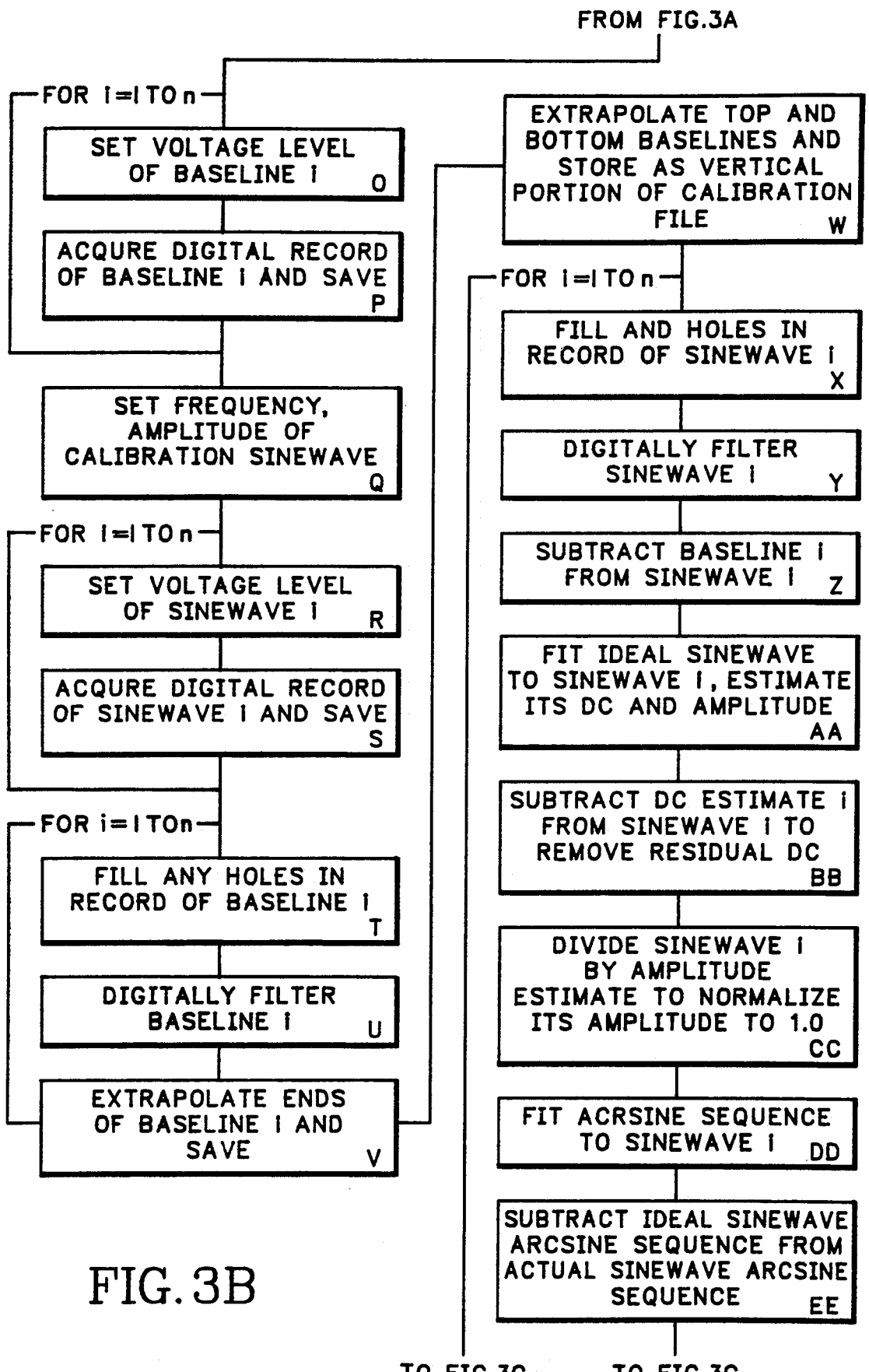
Figure 3C:
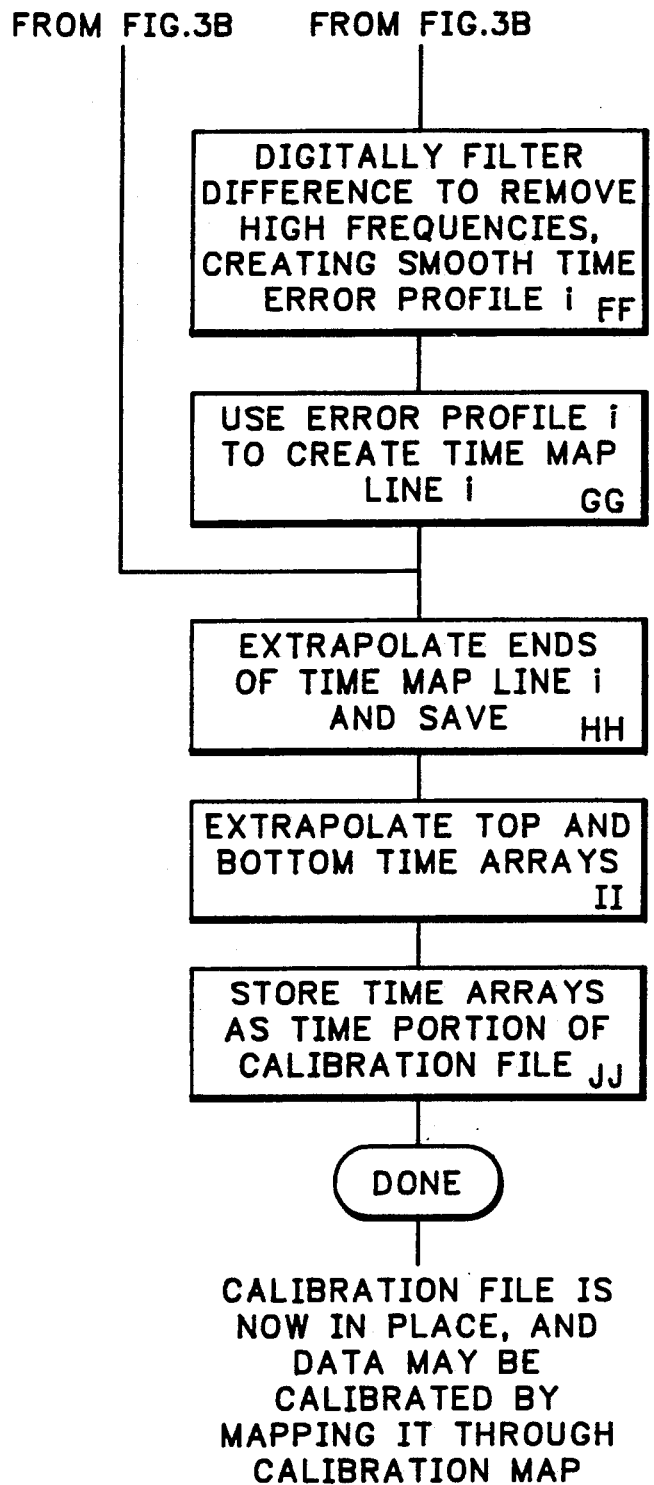

A computer programmer having ordinary skill in the art to which this invention relates can utilize the flow chart in FIG. 3A-C and the other disclosure herein to write a computer program which will implement the present invention in conjunction with the other components in FIG. 1.

System 10 is now calibrated and ready for use. Conductors 40, 42 are removed from data input 24 and trigger input 26, respectively, on oscilloscope 22 in FIG. 1. A conductor (not shown) connected to a circuit which generates a waveform of interest is connected to channel 24 on the oscilloscope and if necessary or desirable a triggering source is connected to trigger input 26. Minimal or no adjustments need be made to System 10 prior to recording and measuring the waveform of interest.

When the waveform generated by the circuit is displayed on the screen of oscilloscope 22, the target in camera 18 records and digitizes the waveform and stores the information in the computer memory in the same manner as previously described in connection with the calibration baselines and sine waves. Waveform 114 in FIG. 14 is a graphical representation of the digital information so stored. The waveform is superimposed on digital record 85 in the same shape, magnitude and position as recorded on the camera target. Each point (represented by a video column) in digital record 85 through which waveform 114 passes is assigned a voltage value based on the values of the two voltage map lines between which the point falls. For example, point 158 is between lines 100, 102 each of which is related to the constant voltage which was used to generate baseline from which lines 100, 102 were derived. Point 158 is assigned a voltage value by linearly interpolating, based on the distance of point 158 from lines 100, 102, between the two voltages.

Point 160, for example, is assigned a voltage value in the same fashion by linearly interpolating between the voltage values associated with voltage map lines 98, 100 using the distance of point 60 from lines 98, 100 in the digital record. After each point in waveform 114 is so associated with a voltage, the waveform is superimposed on digital record 128 as shown in FIG. 15. Each of the points on waveform 114 is then associated with a time value using the same technique as described in connection with FIG. 14. For example, point 158 falls between time map lines 144, 146, each of which includes 512 discrete time values. A time value is assigned to point 158 by linearly interpolating between the time value in line 146 directly beneath point 158 and the time value in line 144 directly above point 158 based on the distance of point 158 from each of the time values.

Similarly, a time value is assigned to point 160 by such interpolation between lines 142, 144. After a time value is so assigned to each point in waveform 114, the waveform is mapped onto a digital record utilizing the time value and voltage value associated with each point on waveform 114 thereby creating a record which compensates for all of the nonlinearities in both horizontal and vertical axes which were determined in the calibration process.

It is to be appreciated that additions and modifications can be made to the foregoing detailed description of the preferred embodiment without departing from the spirit of the invention which is defined in the following claims.

We claim:

1. In a calibration system for a scan convertor having a scanning target with a horizontal axis related to time and a vertical axis related to voltage wherein a voltage map is generated for the vertical axis and a timing map is generated for the horizontal axis, an improved method of generating the timing map for the horizontal axis comprising the steps of:

scanning the target with a calibration periodic waveform having a known frequency;
estimating an ideal waveform for the calibration waveform;
calculating the phase differences between the ideal waveform and the calibration waveform; and
generating timing values for the timing map as a function of the calculated phase differences between the ideal waveform and the calibration waveform.

2. The improved method of claim 1 wherein the step of calculating the phase differences between the ideal waveform and the calibration waveform further comprises the steps of:

generating a function of the calibration waveform;
generating the same function of the ideal waveform; and
subtracting one function from the other.

3. The improved method of claim 2 wherein the function is the arcsine function.

4. The improved method of claim 1 further comprising the steps of:

scanning a plurality of target positions with the calibration periodic waveform;
estimating an ideal waveform for each calibration waveform using the respective calibration waveforms from the plurality of target positions;
calculating the phase differences between each ideal waveform and its associated calibration waveform; and
generating timing values for the timing map at the respective target positions as a function of the calculated phase differences between the associated waveform sets.

5. The improved method of claim 4 wherein the step of calculating the phase differences between each ideal waveform and its associated calibration waveform comprises the steps of:

generating a function of each calibration waveform;
generating the same function of each ideal waveform; and
calculating the difference between each calibration waveform and its associated ideal waveform.

6. The improved method of claim 5 wherein the function is the arcsine function.

7. In a digitizing camera system of the type having a video camera aimed at an oscilloscope screen and a computer for storing and manipulating the video signal generated by the camera, an improved method of generating a timing map for the camera comprising the steps of:

connecting the oscilloscope to a periodic waveform generator;
scanning the oscilloscope screen with a calibration waveform generated by the waveform generator;
storing a digital record of the video signal generated by the calibration generator;
estimating an ideal waveform for the stored digital record of the calibration waveform;
storing a digital record of the ideal waveform;
using the stored digital records to generate a function which is related to the phase differences between the ideal waveform and the calibration waveform; and
generating timing values for the timing map as a function of the phase differences.

8. The improved method of claim 7 wherein the step of using the stored digital records of the ideal waveform and the calibration waveform to generate a function comprises the steps of:

generating a trigonometric function of the ideal waveform;
generating a trigonometric function of the calibration waveform; and
subtracting one function from the other.

9. The improved method of claim 7 further comprising the steps of:

scanning a plurality of oscilloscope screen positions with the calibration waveform;
storing a digital record of the video signal generated by each calibration waveform;
estimating an ideal waveform for the digital record of each calibration waveform;
storing a digital record of each ideal waveform;
using the stored digital records to generate a function for each calibration waveform which is related to the phase differences between each calibration waveform and its associated ideal waveform; and
generating timing values for the timing map as a function of the phase differences between each associated waveform set.

10. The improved method of claim 9 further including the steps of:

dividing the oscilloscope screen into a plurality of sequential horizontal scanning zones which each contains one of said calibration waveforms; and
associating each function with the scanning zone that contained the calibration waveform from which the function was generated.

11. An apparatus for calibrating a scan convertor of the type having a scanning target which has a horizontal axis related to time and a vertical axis related to voltage, the apparatus comprising:

means for scanning the target with a calibration base line voltage;
means for generating a voltage map as a function of the calibration base line voltage;
means for scanning the target with a calibration periodic waveform having a known frequency;
means for estimating an ideal waveform for the calibration waveform;
means for calculating the phase difference between the ideal waveform and the calibration waveform; and
means for generating timing values for a timing map as a function of the phase differences between the ideal waveform and the calibration waveform.

12. The apparatus of claim 11 wherein said means for calculating the phase differences between the ideal waveform and the calibration waveform comprises:

means for generating a function of the calibration waveform;
means for generating the same function of the ideal waveform; and
means for subtracting one function from the other.

13. The apparatus of claim 12 wherein said function is the arcsine function.

14. The apparatus of claim 11 wherein said apparatus further comprises:
- means for scanning a plurality of target positions with the calibration periodic waveform;
- means for estimating an ideal waveform for each calibration waveform using the calibration waveforms from the plurality of target positions;
- means for calculating the phase differences between each ideal waveform and its associated calibration waveform; and
- means for generating timing values for the timing map at the respective target positions as a function of the calculated phase differences between the associated waveform set.

15. The apparatus of claim 14 wherein said means for calculating the phase differences between each ideal waveform and its associated calibration waveform comprises:
- means for generating a function of each calibration waveform;
- means for generating the same function of each ideal waveform; and
- means for calculating the difference between each calibration waveform and its associated ideal waveform.

16. The apparatus of claim 15 wherein said function is the arcsine function.

* * * * *